United States Patent [19]

Ohnishi et al.

[11] Patent Number: 4,592,095
[45] Date of Patent: May 27, 1986

[54] MICROWAVE FET MIXER ARRANGED TO RECEIVE RF INPUT AT GATE ELECTRODE

[75] Inventors: Hiroshi Ohnishi, Tokyo; Sadahiko Yamashita, Sagamihara, both of Japan

[73] Assignee: Matsushita Electric Industrial Co., Ltd., Japan

[21] Appl. No.: 594,684

[22] Filed: Mar. 26, 1984

[30] Foreign Application Priority Data

Mar. 25, 1983 [JP] Japan .................................. 58-50667

[51] Int. Cl.$^4$ .............................................. H04B 1/26
[52] U.S. Cl. .................................... 455/327; 455/317; 455/319; 455/333
[58] Field of Search ............................ 455/317–319, 455/325–327, 333; 330/277; 332/43 B

[56] References Cited

U.S. PATENT DOCUMENTS

| | | |
|---|---|---|
| 3,348,155 | 10/1967 | Recklinghausen .................. 455/333 |
| 3,483,473 | 12/1969 | Lynk, Jr. et al. ..................... 455/317 |
| 3,626,302 | 12/1971 | Nakamura ............................ 455/317 |
| 3,716,730 | 2/1973 | Cerny, Jr. . |
| 3,727,078 | 4/1973 | Wollesen ............................. 455/333 |
| 4,219,779 | 8/1980 | Shinkawa et al. ................... 455/333 |

FOREIGN PATENT DOCUMENTS 138107 8/1983 Japan .................................... 455/333

OTHER PUBLICATIONS

"Microwave Field-Effect Transistors—Theory, Design and Applications" Raymond S. Pengelly, pp. 213–244.

Primary Examiner—Jin F. Ng
Attorney, Agent, or Firm—Lowe, Price, Leblanc, Becker & Shur

[57] ABSTRACT

In a GaAs FET microwave mixer, a gate of the FET is used to receive a radio frequency input signal, while a source of the same is used to inject a local oscillator signal therethrough so as to develop an intermediate frequency signal at a drain of the FET. The mixer of the invention comprises, in addition to such an FET, first and second particular circuits respectively connected to the source, where the first circuit is arranged to exhibit a short-circuited impedance at a frequency band of the radio frequency input signal, and the second circuit is arranged to exhibit an open-circuited impedance at a frequency band of the local oscillator signal. The first and second circuits may be actualized by distributed constant circuits, such as stubs, or by lumped constant circuits, such as resonance circuits.

10 Claims, 12 Drawing Figures

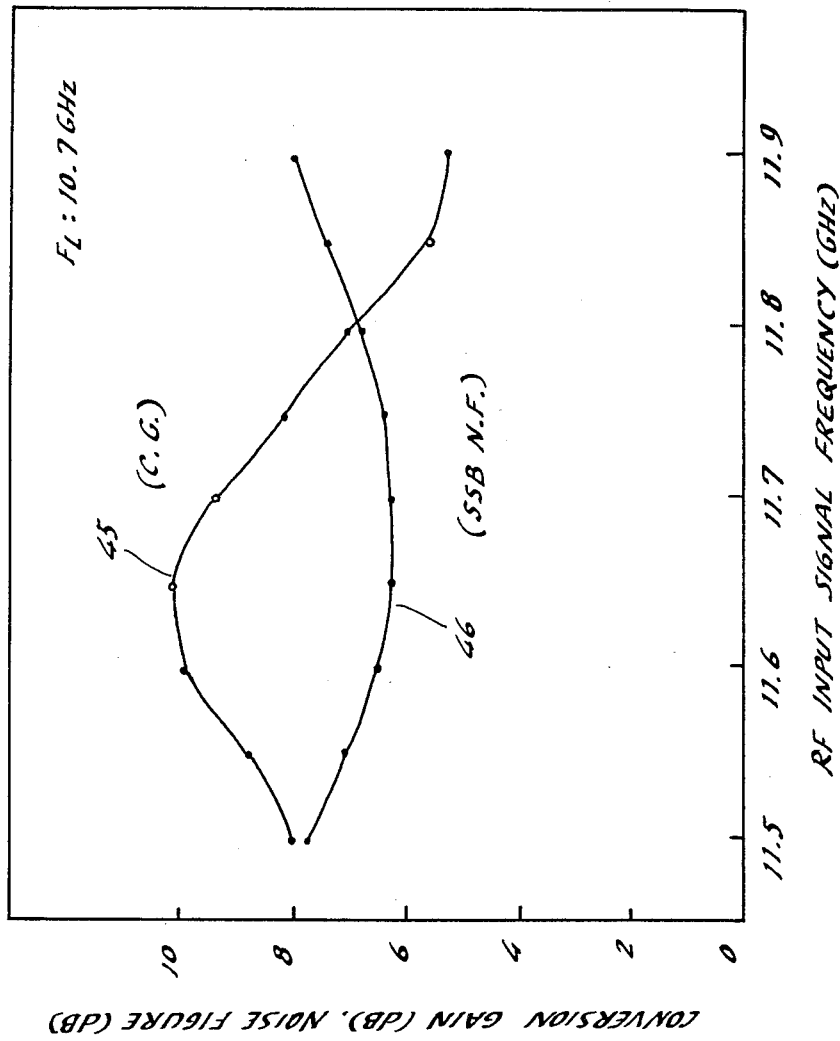

MICROWAVE FET MIXER ARRANGED TO RECEIVE RF INPUT AT GATE ELECTRODE

BACKGROUND OF THE INVENTION

This invention relates generally to radio frequency mixers, and particularly to such mixers using a field effect transistor (FET) for receiving a radio frequency signal of microwave band.

Various types of microwave mixers have hitherto been developed and actualized. These mixers can be divided into two categories, one being single-ended mixers utilizing a single mixing element, and the other being balanced mixers utilizing a plurality of mixing elements. Furthermore, the characteristic of a mixer drastically varies depending on the type of the mixing element, namely, diodes, transistors or FETs.

When a diode or diodes are used as the mixing element of a microwave mixer, although there is an advantage that a relatively wide band can be covered, such a mixer suffers from a drawback that conversion loss necessarily occurs when an input radio frequency signal is converted into an intermediate frequency signal.

Furthermore, some other mixers using a pluality of mixing diodes are apt to be complex in structure.

In mixers using FET(s), it is necessary that the power of a local oscillator signal is sufficiently large in order to reduce loss in input radio frequency signal.

SUMMARY OF THE INVENTION

The present invention has been developed in order to remove the above-described drawbacks inherent to the conventional microwave mixers.

It is, therefore, an object of the present invention to provide a new and useful microwave mixer which exhibits a high sensitivity with low loss, where the structure of the mixer is simple so as to be made small.

According to a feature of the present invention a radio frequency input signal is applied to a gate electrode of an FET, while a local oscillator signal is applied to a source electrode of the FET so as to derive a resultant intermediete frequency signal from a drain of the FET, where first and second particular circuits are respectively connected to the source of the FET. The first circuit is arranged to exhibit a short-circuited impedance at a frequency band of the radio frequency input signal, while the second circuit is arranged to exhibit an open-circuited impedance at a frequency band of the local oscillator signal.

In accordance with the present invention there is provided a microwave mixer comprising: a field effect transistor having a gate for receiving a radio frequency input signal, a source for receiving a local oscillator signal, and a drain for outputting an intermediate frequency signal produced as the result of mixing of the radio frequency input signal and the local oscillator signal; a first circuit connected to the source for exhibiting a short-circuited impedance at a frequency band of the radio frequency input signal; and a second circuit connected to the source for exhibiting an open-cicuited impedance at a frequency band of the local ocillator signal.

BRIEF DESCRIPTION OF THE DRAWINGS

The object and features of the present invention will become more readily apparent from the following detailed description of the preferred embodiments taken in conjunction with the accompanying drawings in which:

FIG. 7 is a graphical representation showing electrical characteristics obtained by the microwave mixer of FIG. 6;

The same or corresponding elements and parts are designated at like reference numerals throughout the drawings

DETAILED DESCRIPTION OF THE INVENTION

Prior to describing the preferred ebmodiments, the above-mentioned conventional mixers will be described for a better understanding of the present invention.

Figure 1:
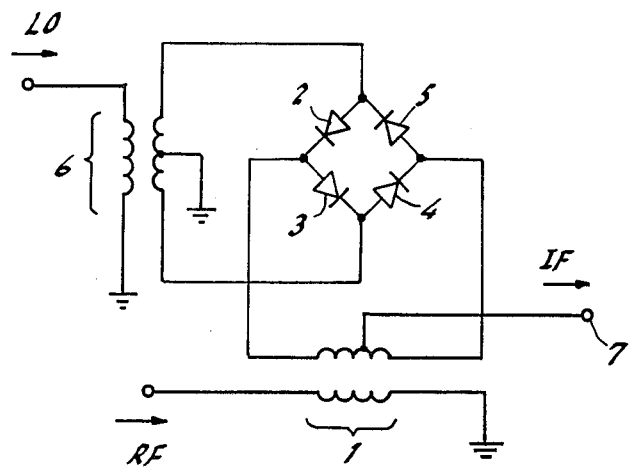
FIGS. 1 to 3 are diagrams showing conventional microwave mixers.

FIG. 1 shows a fundamental structure of a well known double-balanced mixer using diodes. In FIG. 1, the references 1 and 6 are balance-to-unbalance transformers respectively used for a radio frequency input signal RF and for a local oscillator signal LO. The references 2, 3, 4 and 5 are diodes, while the reference 7 is an output terminal for deriving a resultant intermediate frequency IF signal. In the circuit arrangement of FIG. 1, although there are advantages that separation of the radio frequeny input signal RF from the local oscillator signal LO is satisfactory and the mixer is capable of covering a relatively wide frequency range with a stable characteristic, the arrangement requires a plurality of mixing diodes and two balance-to-unbalance transformers 1 and 6. This results in complex structure. Furthermore, the mixer of FIG. 1 necessarily suffers from conversion loss when the radio frequency is converted into an intermediate frequency.

Figure 2:
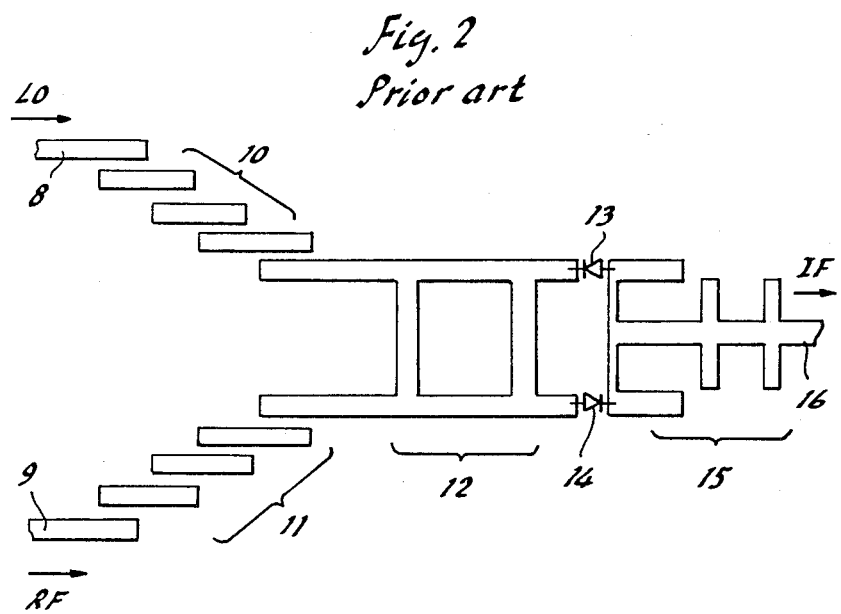

FIG. 2 shows another conventional microwave mixer, which is a balanced mixer using a pair of mixing diodes. This mixer is actualized by microwave integrated circuits (MICs).

The references 8, 9 and 16 are respectively an input terminal for receiving a local oscillator signal LO, an input terminal for receiving a radio frequency input signal RF, and an output terminal for deriving an intermediate frequency signal IF. The references 10 and 11 are respectively a band pass filter for passing the local oscillator signal LO, and a band pass filter for selectively passing the radio frequency input signal RF and suppressing an image signal. The reference 12 is a directional coupler of 3 dB branch-line type, which is used for providing satisfactory separation between the local oscillator signal LO and the radio frequency input signal RF, and for applying the local oscillator signal LO and the radio frequency input signal RF to the diodes 13 and 14 equally. The reference 15 is a low pass filter for selectively passing the intermediate frequency signal IF with the radio frequency input signal RF and the local oscillator signal LO being suppressed.

In the arrangement of FIG. 2, although there is an advantage that the separation between the radio frequency input signal RF and the local oscillator signal LO is satisfactory, there is a problem that the characteristic of the mixer is deteriorated due to the presence of the band pass filter 11 formed of an MIC at the input stage of the radio frequency input signal RF. Furthermore, the mixer of FIG. 2 is apt to be bulky due to the provision of the directional coupler 12.

Figure 3:
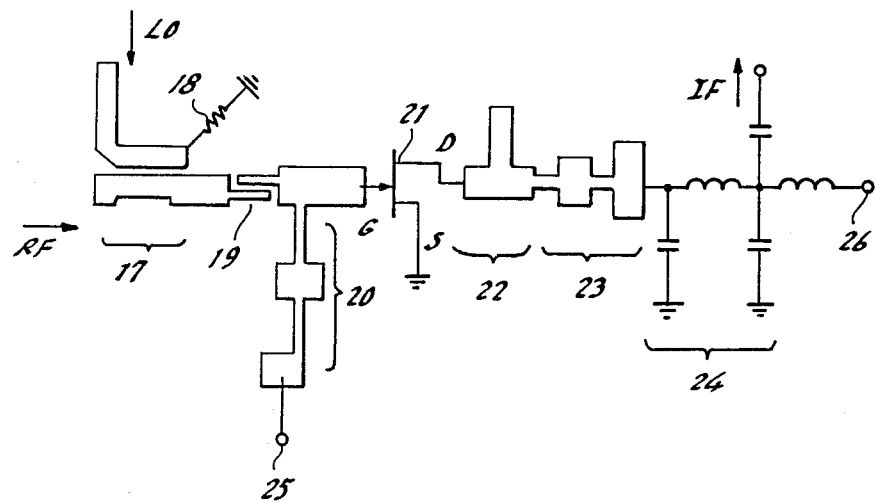

FIG. 3 shows another conventional microwave mixer, which uses a GaAs FET, where the mixer is shown by way of an MIC structure. In FIG. 3, the reference 17 is a coupler of distribution coupling type, and the reference 18 is a terminal resistor of 50 ohms. The reference 19 is a D.C. block coupled at a length which is one fourth of the wavelength ($\lambda_{Rg}$) of the radio frequency input signal RF on a dielectric substrate. The reference 20 is a low pass bias filter, and the reference 21 is a microwave GaAs FET. The reference 22 is a radio frequency trap having a $\lambda_{Rg}/4$ stub of open-ended type, and the reference 23 is a low pass filter for selectively passing the intermediate frequency signal IF. The reference 24 is a low pass matching circuit of the intermediate frequency signal, and the references 25 and 26 are respectively a gate bias terminal and a drain bias terminal.

In the circuit arrangement of FIG. 3, it is necessary that the local oscillator signal LO and the radio frequency input signal RF are respectively applied to the gate of the FET 21. To this end the coupler for the local oscillator signal LO is provided at the input side of the FET 21. However, since the coupler 17 is provided at the input side of the FET 21, the radio frequency input signal RF suffers from loss when it is inputted to the gate of the FET 21. As a result noise figure NF of the mixer becomes worse. In order to reduce such loss of the radio frequency input signal RF, the coupling degree of the coupler 17 for the local oscillator signal LO may be lowered. However, this necessitates the use of a large-power local oscillator.

Moreover in the case that the frequency difference between the local oscillator signal LO and the radio frequency input signal RF is larger than 1 GHz, it is extremely difficult to acualize a matching circuit at the gate side of the FET 21 so as to be able to match with both the local oscillator frequency band and the input radio frequency band.

Figure 4:
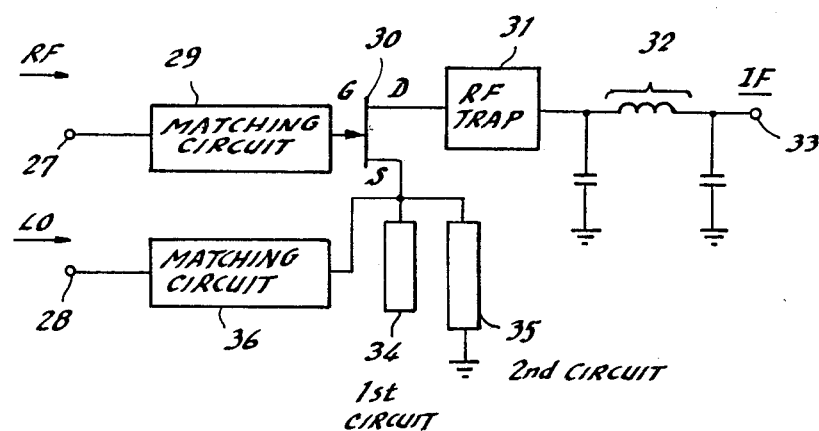
FIG. 4 is a schematic diagram showing a fundamental structure of the microwave mixer according to the present invention.

Referring now to FIG. 4 a fundamental circuit structure of a microwave mixer according to the present invention is shown.

In FIG. 4, the references 27, 28 and 33 are respectively an input terminal for receiving an input radio frequency signal RF, an input terminal for receiving a local oscillator signal LO, and an output terminal for deriving an intermediate frequency signal IF. The reference 30 is a microwave GaAs FET having a gate G responsive to an output signal from an input radio frequency signal matching circuit 29 connected to the radio frequency signal input terminal 27. The FET 30 has a source S responsive to an output signal from a local oscillator signal matching circuit 36 connected to the local oscillator signal input terminal 28. The source S is also connected to a first circuit 34 arranged to exhibit a short-circuited impedance at a frequency band of the radio frequency input signal RF, and a second circuit 35 arranged to exhibit an open-circuited impedance at a frequency band of the local oscillator signal LO. The first circuit 34 may be an open-ended stub having an electrical length of one fourth of the wavelength ($\lambda_{Rg}$) of the input radio frequency on an unshown substrate as will be described in detail with reference to FIG. 6. Similarly, the second circuit 35 may be a short-ended stub having an electrical length equal to one fourth of the wavelength ($\lambda_{Lg}$) of the local oscillator signal LO on the substrate. The FET 30 has a drain D connected via a radio frequency trap 31 to an intermediate frequency matching circuit 32 of a low pass filter type.

Figure 5A:
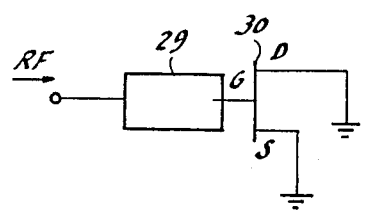
FIGS. 5A, 5B and 5C are equivalent circuits for the description of the operation of the mixer of FIG. 4.
Figure 5B:
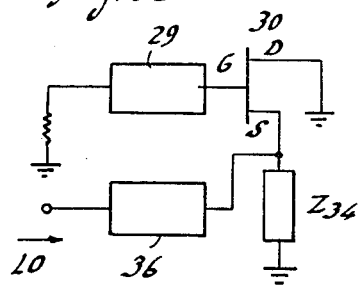
Figure 5C:
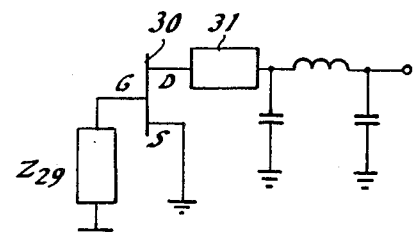

With the circuit configuration of FIG. 4, the impedances at respective terminals of the FET 30 with respect to the radio frequency RF, the local oscillator frequency LO and the intermediate frequency IF are determined as shown by equivalent circuits shown in FIGS. 5A to 5C.

FIG. 5A is an equivalent circuit showing the impedances at respective terminals of the FET 30 with respect to the radio frequency band. As clearly seen, the impedances at both source S and drain D are of short-circuited impedances. Therefore, the radio frequency signal RF is inputted via the input matching circuit 29 to the gate G of the FET 30 without any loss.

FIG. 5B is an equivalent circuit showing the impedance at respective terminals of the FET 30 with respect to the local oscillator frequency band. As illustrated, the impedance at the source S is equal to the impedance $Z_{34}$ provided by the $\lambda_{Rg}/4$ stub 34. As a result, the local oscillator signal LO fed through the the local oscillator signal matching circuit 36 is effectively fed to the source S of the FET 30 so as to pump a capacitor Cgs across the gate G and the source S of the FET 30. Thus the input radio frequency signal RF fed via the gate of the FET 30 is frequency converted.

FIG. 5C is an equivalent circuit showing the impedances at respective terminals of the FET 30 with respect to the intermediate frequency band. As clearly seen, because of the presence of the $\lambda_{Lg}/4$ stub 35 of short-ended type the impedance at source S is of substantially short-circuited impedance, while the impedance at gate G is equal to the impedance $Z_{29}$ of the intermediate frequency matching circuit 29. As a result, the FET 30 operates as a low-noise amplifier with respect to intermediate frequency band.

The mixer of FIG. 4 operates as follows:

A microwave radio frequency input signal applied from the input signal terminal 27 is injected via the input matching circuit 29 into the gate G of the FET 30. Meanwhile, the local oscillator signal LO applied to the local oscillator signal terminal 28 is injected via the matching circuit 36 into the source S of the FET 30. The radio frequency input signal RF inputted through the gate G is amplified by the FET 30, and is mixed with the local oscillator signal LO injected through the source S to produce, within the FET 30, the intermediate frequency signal IF whose frequency equals the difference between the frequencies of the radio frequency input signal RF and the local oscillator signal LO. The intermediate frequency signal IF produced within the FET 30 is then amplified by the FET 30, and is outputted via the radio frequency trap 31, and the low pass filter matching circuit 32 to the output terminal 33.

Figure 6:
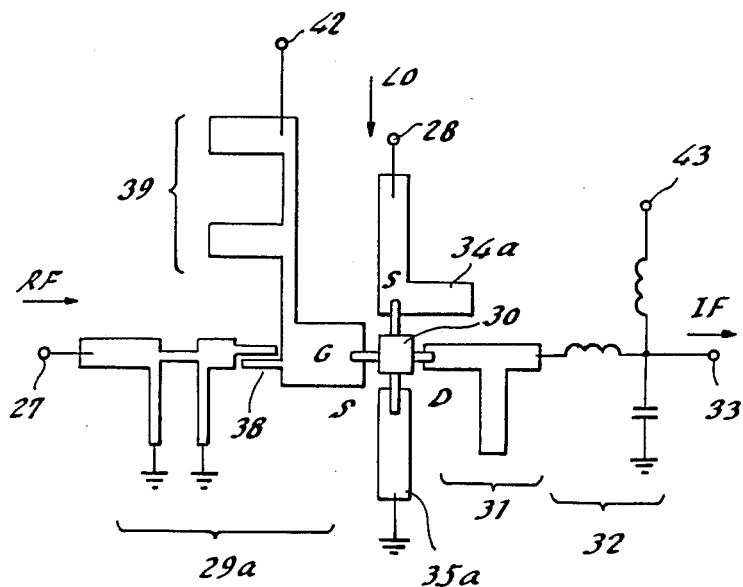
FIG. 6 is a schematic diagram showing an embodiment of the microwave mixer according to the present invention.

FIG. 6 shows an embodiment of the mixer according to the present invention, constructed by way of an MIC by using the fundamental structure of FIG. 4.

In FIG. 6, the reference 29a is an input matching circuit of high pass filter type for passing the radio frequency input signal RF, where the input matching circuit 29a comprises a D.C. block 38 of distribution coupling type. The reference 39 is a low pass bias circuit connected to a gate bias terminal 42 at its one end. The references 34a and 35a are stripline stubs actualizing the first and second circuits 34 and 35 of FIG. 4. The references 31 and 32 are respectively radio frequency trap and intermediate frequency matching circuit of low pass filter type both corresponding to those in FIG. 4. The MIC mixer arrangement of FIG. 6 does not comprise a portion corresponding to the local oscillator signal matching circuit 36 of FIG. 4. However, such a matching circuit may be employed if desired or necessary.

With the function of the $\lambda_{Rg}/4$ stub 34a of open-end type, the impedance at the source S of the FET 30 is of short-circuit. Therefore, the radio frequency input signal RF can be inputted to the gate G of the FET 30 without loss via the input matching circuit 29a.

On the other hand, the local oscillator signal LO is injected into the source S of the FET 30 from the local oscillator input terminal 28. In this embodiment, although no matching circuit, such as the circuit 36 in FIG. 4, for the local oscillator signal LO is used, the local oscillator signal LO can be effectively applied to the FET 30 with relatively low output power, such as 5 milliwatts or so, of the local oscillator. This is because impedance matching between the source S and the local oscillator is relatively satisfactory.

FIG. 7 is a graph showing the characteristics of the mixer of FIG. 6 according to the present invention, where the characteristics are obtained under a condition that the frequency of the local oscillator signal LO is 10.7 GHz, the frequency range of the input radio frequency is from 11.5 to 11. 9 GHz, and the intermediate frequency IF is within 1 GHz band.

In FIG. 7, the X distance of the graph indicates the frequency of the radio frequency input signal RF, while the Y distance indicates conversion gain and SSB noise figure NF. Namely, a curve 45 shows the conversion gain variation, while another curve 46 shows the SSB noise figure variation both with respect to RF input signal frequency. As is apparent from FIG. 7, satisfactory characteristics are obtained such that when the frequency of the radio frequency input signal RF is at 11.65 GHz, conversion gain of 10.0 dB and noise figure of 6.2 dB are respectively obtained.

It is to be noted that the mixer according to the present invention does not require coupling circuits for the local oscillator signal LO within the cicuit or transmission line between the RF input terminal 27 and the gate G of the FET 30 since the local ocillator signal LO is injected into the source S. As a result, the input matching circuit 29a can be designed with only the RF input signal being considered. Accordingly, the RF input signal can be effectively inputted into the FET 30 without suffering considerable loss, thereby it is possible to provide a low-loss, therefore, high-sensitivity mixer.

Figure 8A:
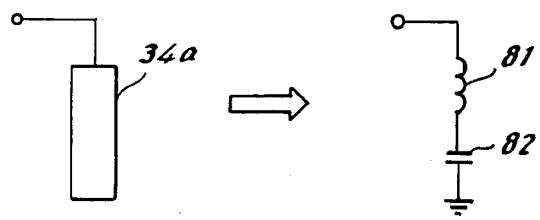
FIGS. 8A and 8B are diagrams showing lumped constant circuits which can be used in place of the stubs of FIG. 6.
Figure 8B:
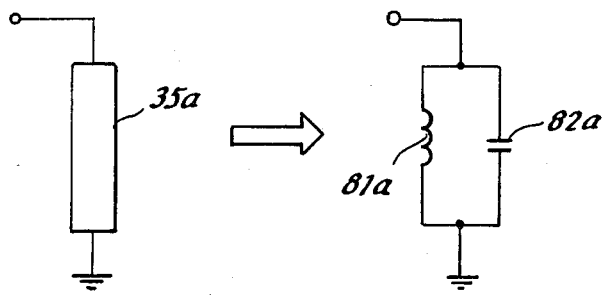

In the embodiment of FIG. 6, although the stubs 34a and 35a, which are distributed constant circuits, are connected to the source S of the FET 30, these distributed constant circuits 34a and 35a may be replaced with lumped constant circuit or lines. FIGS. 8A and 8B show that lumped constant circuits at the right are respectively equivalent to distributed constant circuits at the left. Namely, the stub 34a of open-end type of FIG. 6 can be replaced with a series resonance circuit of an inductor 81 and a capacitor 82, while the stub 35a of short-end type of FIG. 6 can be replaced with a parallel resonance circuit of an inductor 81a and 82a.

When lumped constant circuits shown at the right of FIGS. 8A and 8B are used, the size of entire mixer can be reduced compared to the case in which distributed constant cicuits are used where the width and the minimum length of the stripline constituting the stub 34a or 35a are limited.

Figure 9:
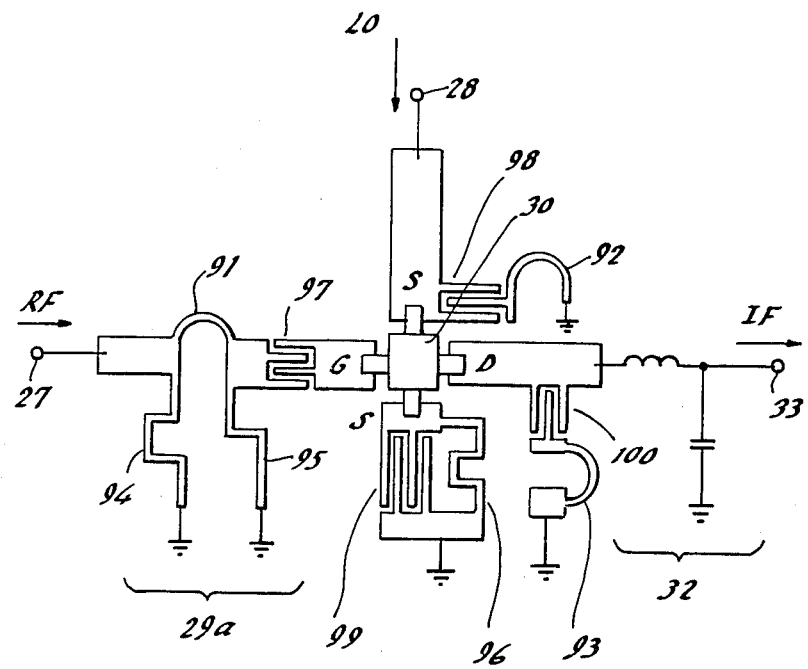
FIG. 9 is a schematic diagram showing another embodiment of the microwave mixer according to the present invention.

Hence, reference is now made to FIG. 9 showing an embodiment of the mixer actualized by using such lumped constant circuits. In FIG. 9, the references 91, 92 and 93 are loop inductors, the references 94, 95 and 96 are meander line inductors, and the references 97, 98, 99 and 100 are inter-digital capacitors. Amongst these lumped constant circuits, the loop inductor 91, and the meander line inductors 94 and 95 constitute an input matching circuit 29b. Similarly, the loop inductor 92, and the inter-digital capacitor 98 constitute a series resonance circuit which functions as the first circuit 34 of FIG. 4. The inductor 92 and the capacitor 98 are selected so that the series resonance circuit resonates at the RF input frequency. The meander line inductor 96 and the inter-digital capacitor 99 constitute a parallel resonance circuit which functions as the second circuit 35 of FIG. 4. The inductor 96 and the capacitor 99 are selected so that the parallel resonance circuit resonates at the local oscillator frequency.

With this arrangement, the impedance of the series resonance circuit comprising the inter-digital capacitor 98 and the loop inductor 92, exhibits a short-circuited impedance at the RF input signal frequency band. Furthermore, the impedance of the parallel resonance circuit comprising the inter-digital capacitor 99 and the meander line inductor 96, exhibits an open-circuited impedance at the local oscillator frequency band, and an inductive impedance at a band higher than the local oscillator frequency band.

The meander line inductors 94, 95 and 96 as well as the loop inductors 91, 92 and 93 can be formed such that the width of the line is below 30 to 100 micrometers, and the length of the line is below 1.5 millimeters. In addition the inter-digital capacitors 97, 98, 99 and 100 can be formed such that the width of the lines and the gap or space between consecutive lines are between 30 and 50 micrometers. Therefore, the entire mixer of FIG. 9 can be made small.

The above-described embodiments are just examples of the present invention, and therefore, it will be apparent for those skilled in the art that many modifications and variations may be made without departing from the spirit of the present invention.

What is claimed is:

1. A microwave mixer comprising:
   (a) a field effect transistor having a gate for receiving a radio frequency input signal, a source for receiving a local oscillator signal, and a drain for outputting an intermediate frequency signal produced as the result of mixing of said radio frequency input signal and said local oscillator signal;
   (b) a first circuit connected directly to said source for exhibiting a short-circuited impedance at a frequency band of said radio frequency input signal; and
   (c) a second circuit connected to said source for exhibiting an open-circuited impedance at a frequency band of said local oscillator signal.

2. A microwave mixer as claimed in claim 1, wherein said first circuit comprises a stripline of open-end type which has an electrical length of a quarter-wave at said frequency band of said radio frequency input signal.

3. A microwave mixer as claimed in claim 1, wherein said second circuit comprises a stripline of short-end type which has an electrical length of a quarter-wave at said frequency band of said local oscillator signal.

4. A microwave mixer as claimed in claim 1, wherein said first circuit comprises a series resonance circuit arranged to resonate at said frequency band of said radio frequency input signal.

5. A microwave mixer as claimed in claim 1, wherein said second circuit comprises a parallel resonance circuit arranged to resonate at said frequency band of said local oscillator signal.

6. A microwave mixer as claimed in claim 1, wherein said field effect transistor is a GaAs field effect transistor.

7. A microwave mixer as claimed in claim 1, further comprising a trap connected to said drain for rejecting said radio frequency input signal and said local oscillator signal.

8. A microwave mixer as claimed in claim 1, further comprising a radio frequency input signal matching circuit connected to said gate for supplying said gate of said field effect transistor with said radio frequency signal therethrough.

9. A microwave mixer as claimed in claim 1, further comprising an intermediate frequency matching circuit responsive to said intermediate frequency signal from said drain of said field effect transistor.

10. A microwave mixer as claimed in claim 1, further comprising a local osicllator signal matching circuit responsive to said local oscillator signal so that said local oscillator signal is fed via said local oscillator signal matching circuit to said source of said field effect transistor.

* * * * *